United States Patent [19]
Yang

[11] Patent Number: 4,794,343
[45] Date of Patent: Dec. 27, 1988

[54] METHOD AND APPARATUS FOR CALIBRATING AND EQUALIZING A MULTI-CHANNEL AUTOMATIC GAIN CONTROL AMPLIFIER

[75] Inventor: Steve S. Yang, Chatsworth, Calif.

[73] Assignee: Hughes Aircraft Company, Los Angeles, Calif.

[21] Appl. No.: 926,317

[22] Filed: Oct. 31, 1986

Related U.S. Application Data

[63] Continuation-in-part of Ser. No. 809,641, Dec. 16, 1985, abandoned.

[51] Int. Cl.$^4$ .......................... H03F 3/68; H03G 3/00
[52] U.S. Cl. .......................................... 330/2; 330/52; 330/124 R; 330/129; 330/279; 330/295
[58] Field of Search ................. 330/2, 52, 124 R, 129, 330/278, 279, 295

[56] References Cited

U.S. PATENT DOCUMENTS

| | | | |
|---|---|---|---|
| 3,035,232 | 5/1962 | Draganjac et al. | 330/2 |
| 3,119,077 | 1/1964 | Saari | 330/145 |
| 3,942,181 | 3/1976 | Berrod et al. | 330/86 X |
| 4,219,780 | 8/1980 | Roulston et al. | 330/52 |
| 4,335,384 | 6/1982 | Roos | 330/2 X |
| 4,481,477 | 11/1984 | Wittig | 330/2 |

FOREIGN PATENT DOCUMENTS 2053542 5/1972 Fed. Rep. of Germany .
2220111 9/1974 France .

Primary Examiner—James B. Mullins
Attorney, Agent, or Firm—M. W. Sales; R. A. Hays; A. W. Karambelas

[57] ABSTRACT

A plurality of amplifier channels, wherein each channel is automatically gain controlled by a gain control signal and wherein the gain of each channel is a known function of a plurality of constants of corresponding to each amplifier and of the gain control signal, can be calibrated by the following method. The method comprising the steps of measuring each output of each amplifier at a corresponding plurality of gain control values and at a corresponding input to each amplifier. The number of the plurality of the constants equals the number of the plurality of the gain control values. The method continues by computing the gain of each amplifier at the step of measuring. The constants corresponding to each amplifier are then computed according to the function and computed gain. A corresponding changed gain control signal is applied to each amplifier according to the function to set the corresponding gain of each amplifier to a corresponding predetermined calibrated value. By virtue of this methodology, the gain of each channel of a multiple channel amplifier can be not only calibrated to equal a preset value, but the gains of each of the channels can be matched, all without the use of any other additional test equipment.

5 Claims, 3 Drawing Sheets

METHOD AND APPARATUS FOR CALIBRATING AND EQUALIZING A MULTI-CHANNEL AUTOMATIC GAIN CONTROL AMPLIFIER

RELATION TO OTHER APPLICATIONS

This application is a Continuation-in-Part of an application bearing Ser. No. 06/809,641 filed Dec. 16, 1985, having the same inventor and titled "A Method of Calibrating and Equalizing a Multi-Channel Automatic Gain Control Amplifier", and now abandoned.

BACKGROUND OF THE INVENTION

1. Field of the Invention

The invention relates to the field of calibration of analog circuits and, in particular, relates to the calibration of the gain of multiple channel amplifiers wherein temperature compensation and automatic gain control is provided to each channel.

2. Description of Related Art

In certain types of applications, automatic gain control of an amplifier is essential to the effective or useful functioning of the system. Such applications include radar systems, and communication systems, and particularly those radar systems which include multiple amplifier channels where the gain of the multiple channels must be equalized. Clearly, in systems like radar systems in which precise instrumented electronic measurements are continually being made as an essential part of the systems' functioning, any drift in gain in even one of the multiple channels will destroy the absolute accuracy of measurement which is attempting to be made.

In the prior art, gain adjustments in amplifiers in radar systems were made using a delta automatic gain control circuit (AGC) for multiple channels of the amplifier. However, even where each channel is separately compensated, the relative gain among channels must not only be initially calibrated or equalized, but such equalization must be maintained over time as well. Therefore, the prior practice has been to provide an additional delta AGC circuit to compensate for drifts in gain among the various channels of a multiple channel amplifier. Nevertheless, such prior art designs require periodic calibration to match the gain of the multiple channels. This calibration must be achieved through the use of sophisticated, delicate and high precision built-in test equipment.

What is needed, then, is a simple procedure for calibrating an amplifier and a design for an amplifier which includes an automatic gain control which is of such a nature that calibration can be made in the field without the need of sophisticated built-in test equipment.

SUMMARY OF THE INVENTION

The invention is a method for calibrating a parameter of amplifier gain. The parameter of the amplifier gain is responsive to the function of a control signal coupled to the amplifier and is characterized by being determined by at least one functional constant. The method comprises the steps of measuring at least one functional constant of the amplifier gain at a corresponding predetermined value of the control signal. The method continues with the step of changing the functional parameter of the amplifier to another predetermined calibrated value according to the measured other functional constant. By reason of this combination of steps, the parameter of the amplifier gain is calibrated to assume the predetermined calibrated value without the use of additional test equipment.

In particular, the step of measuring comprises the steps of separately measuring a plurality of functional constants of the amplifier at a corresponding plurality of predetermined values of the control signal. The step of measuring comprises measuring at least one functional constant at a predetermined value of an automatic gain control (AGC) voltage and the step of changing the parameter changes the gain of the amplifier.

In the illustrated embodiment, the amplifier is an impedance dependent amplifier, which dependent impedance is a function of a control signal, and the step of measuring at least one functional constant comprises the step of determining the constants by measurement and from a functional relationship of a controlling dependent impedance in the amplifier. The controlling impedance is a function of the control signal and at least one functional constant.

Again in the illustrated embodiment, the step of measuring the plurality of functional constants more specifically comprises the steps of determining the constants by measurement and from a functional relationship of a controlling impedance in the amplifier. The controlling impedance being a function of the control signal and the plurality of functional constants.

What is expressly contemplated is a method as discussed above where the controlling impedance of a device wherein:

$$\log R = a + b \log(-V)$$

where
R is the impedance of the device,
V is the control signal applied to the device, and
a and b are the circuit constants characteristic of the device, and where, in the step of measuring the plurality of functional constants, a first corresponding value of the control signal sets $$\log(-V) = 0,$$

and where, in the step of measuring the plurality of circuit constants, a second corresponding value of the control signal sets $$\log(-V) = 1.$$

The illustrated method assumes that the control signal is an AGC voltage and the parameter is voltage gain. Depending on the logarithmic base contemplated in the function, the first corresponding value of the control signal is 1 volt, and where the second corresponding value of the control signal is approximately 2.718 volts, where a natural logarithm is used; the first corresponding value of the control signal is 1 volt, and the second corresponding value of the control signal is 10 volts, where a logarithm to the base ten is used; and more generally, the first corresponding value of the control signal is 1 volt, and the second corresponding value of the control signal is x volts, where a logarithm to the base x is used.

In the preferred embodiment, a plurality of the amplifiers are serially cascaded. The parameter of the cascaded series of amplifiers is measured and changed as if the cascaded series of amplifiers were a single amplifier. In the case where a plurality of sets of cascaded amplifiers are provided, each separate set of cascaded amplifiers defines a channel. The method then further comprises the steps of separately measuring and changing each one of the plurality of channels.

Matched channels are achieved where the step of changing the parameter for each one of the plurality of channels comprises, in turn, the step of changing the parameter to a predetermined value common to each one of the plurality of channels.

From yet another viewpoint, the invention is a method of calibrating the gain of a plurality of amplifiers whose gain in dB for each amplifier is given by:

$$G = C + D \log(-V)$$

where
G is the gain of each amplifier,
−V is an AGC signal applied to each amplifier, and
C and D are circuit constants corresponding to each amplifier.

The method comprises the steps of measuring the circuit constants for each amplifier at two corresponding predetermined AGC voltages; and changing the gain of each amplifier to a corresponding predetermined value.

Stated still another way, the invention is a method of calibrating a plurality of amplifier channels wherein each channel is automatically gain controlled by a gain control signal. The gain of each channel is a known function of a plurality of constants corresponding to each of the amplifiers and to the gain control signal. The method comprises the steps of measuring the output of each amplifier at a corresponding plurality of gain control values and measuring the corresponding inputs to each amplifier. The plurality of the constants is equal in number to the number of the plurality of the gain control values. The method then continues with the step of computing the gain of each amplifier at the step of measuring. Next is the step of computing the constants corresponding to each amplifier according to the function and computed gain. The last step is one of applying a corresponding changed gain control signal to each amplifier according to the function to set the corresponding gain of each amplifier to a corresponding predetermined calibrated value.

The invention and its various embodiments can better be understood by now turning to the following figures.

DESCRIPTION OF THE PREFERRED EMBODIMENTS

Figure 1:
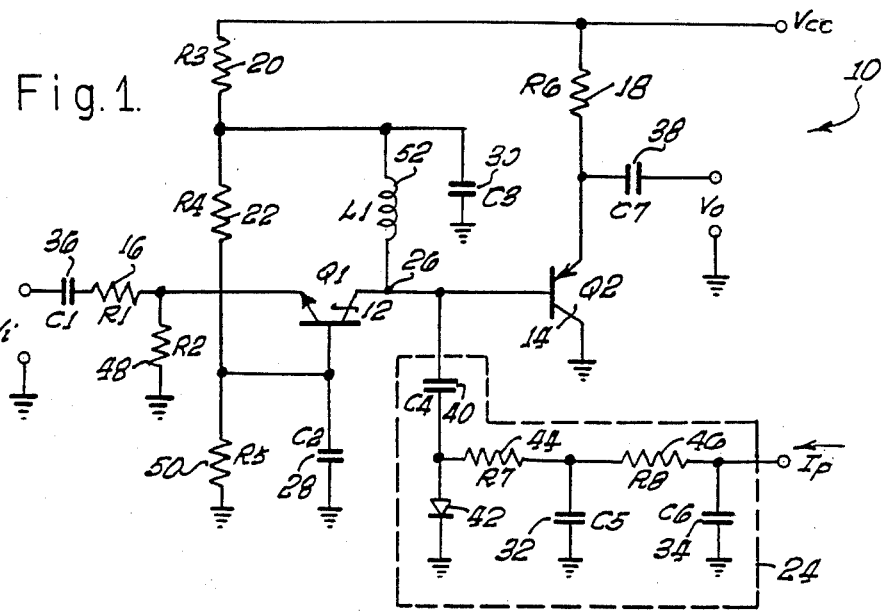
FIG. 1 is a schematic diagram of an intermediate frequency (IF) single channel amplifier incorporating the invention.

The invention is a method for calibrating an amplifier without the use of sophisticated built-in test equipment. Where, for example, such amplifiers are in radar units, the radar may be calibrated in the field without any specialized built-in equipment. Before describing the methodology of calibration, the design and operation of the amplifier so calibrated should be clearly understood and kept in mind.

An internal impedance dependent amplifier has a gain as determined by the impedance at a predetermined node within the amplifier. A PIN diode is coupled to the predetermined node. The PIN diode is driven with a forward biased current which serves as the accurate gain control (AGC) signal for the amplifier. The PIN diode is driven by an operational amplifier generating Ip in such a manner that the impedance of the PIN diode which is coupled to the predetermined node in the amplifier is temperature indpendent i.e., is temperature compensated. Because the PIN diode has an impedance given by:

$$\log R = A + b \log Ip,$$

where
R is the impedance of the PIN diode;
Ip is the forward biasing current; and
A and B are the constants which are different for each PIN diode, the AGC voltage −Vc applied to the operational amplifier 56 driving the PIN diode is log linear with respect to the impedance of the PIN diode and, hence, also log linear with respect to the voltage gain of the impedance dependent amplifier to which the PIN diode is coupled. This characteristic of the gain of the amplifier allows the amplifier to be cascaded in series and to preserve the same impedance relation as expressed above for the cascaded series of amplifiers as well. Thus, the voltage gain of the cascaded series of amplifiers is also log linear with respect to a common AGC voltage applied to each of the amplifiers of the series.

As will be made apparent in the following description, the noise figure of the amplifier or a cascade of such amplifiers is substantially independent of the AGC voltage because gain is determined by the PIN diode's impedance, whose contribution to noise figure is relatively independent of the magnitude of the impedance or, at worst, a very slowly varying function of its impedance.

The amplifier is temperature independent and gain tracking by using the radio frequency (RF) characteristics of a PIN diode. It is known that the logarithm of the RF resistance of a PIN diode is logarithmically linear with respect to its forward current. The amplifier thus has its gain resistively controlled. By using a log linear PIN diode as the gain determining resistive element, amplifier gain can then be made log linear relative to the gain control voltage. As a result, an amplifier with a high dynamic range, low intermodulation distortion and gain control with output noise reduced proportional to the gain reduction is realized. For example, using a typical PIN diode in a cascaded amplifier, gain control accuracy of better than 0.5 dB over a range of 60 dB with temperature changes of more than 25° C. in the temperature range of −55° C. to 85° C. is achieved.

The constants a and b of the mathematical function of the amplifier gain can be verified by taking input and output readings at only two points. This results in considerable ease in gain calibration.

Because of the ease in gain calibration, the design of the amplifier readily allows for adjustments to be made taking into account the individual constants of the operative gain determining element, i.e., the PIN diode.

As will be ascertainable below, the center frequency of the amplifier is set by a single inductive element, which permits a hybrid circuit design of small size and easily adjustable performance. This makes the design a universal circuit block usable in a wide variety of applications with no redesign required.

Of particular advantage is the fact that as the gain control voltage changes in the circuit, the phase of the center frequency does not change. This is clearly an advantageous attribute where, as in radar circuits, the phase of a received signal carries significant information. In the prior art, compensation of some sort was required to accommodate phase changes in the center frequency of the tuned amplifiers as gain changed. This is unnecessary in the circuit of the amplifier used herein.

As will further be described below, as the current in the PIN diode increases (increasing gain reduction), the voltage distortion across the PIN diode decreases. Thus, the linearity of the circuit actually improves with gain reduction.

Exactly how these advantages are accomplished is better understood by turning to the schematic diagram of FIG. 1.

The amplifier, generally denoted by reference numeral 10, is a resistance dependent amplifier which forms the core of the log linear gain control IF amplifier. Amplifier 10 is comprised of two active devices, complementary transistors 12 and 14, and input resistor 16. Ignoring frequency dependent impedances in FIG. 1 for the moment, disconnecting subcircuit 24, substituting a resistor Rc for it (which assumes that Rc is not more than one-tenth the value of the output impedance of transistor 12 and input impedance of transistor 14), and concentrating only on the transistor parameters and resistances, it can be shown that the voltage gain of amplifier 10 is approximately equal to:

$$Vo/Vi = Rc/Ri,$$

where
Vo is the output voltage;
Vi is the input voltage;
Rc is the resistance of node 26 which is dominated by PIN diode 42; and
Ri is the amplifier input resistance.

Hence, the gain of the amplifier is the ratio of its input impedance, Ri, and the impedance of PIN diode, Rc. Many of the advantages of the circuit design discussed above result from the dependence of gain and other circuit parameters on the PIN diode's impedance and the inherent properties of the PIN diode. Therefore, amplifier 10 combines the voltage gain of transistor 12 with the current gain of transistor 14 to provide an overall power gain with fixed input and output impedances.

What needs to be particularly emphasized here is that the gain of amplifier 10 is almost entirely determined by the ratio of a function of the gain control resistor, Rc, to the input resistance, Ri, and less affected by any transistor parameters than in most other amplifier designs. Alternatively stated, the gain is determined by the resistance or impedance at node 26.

The log linear gain control is effectuated through a subcircuit, generally denoted by reference numeral 24. As implied in the above discussion of amplifier 10, the gain of the amplifier is determined by the RF impedance at node 26.

Capacitors 28–34 are RF decoupling capacitors used in a conventional sense in amplifier 10 in a manner which shall not be further described here. Similarly, capacitors 36 and 38 are input and output dc blocking capacitors, respectively, which are also conventionally employed at the input and output of the single stage of amplifier 10 shown in FIG. 1. Capacitor 40 is, however, an RF coupling capacitor which is used to couple the RF signal, which is being amplified, to PIN diode 42. It is well known that the RF resistance of the PIN diode is given by the following equation:

$$\log R = A + B \log Ip$$

where
R is the RF resistance of PIN diode 42;
A and B are constants which will be determined by individual diode; and
Ip is the DC forward current of the PIN diode 42.

Therefore, by applying a predetermined voltage, $-Vc$, to diode 42, the RF resistance can be varied. Resistors 44 and 46 are thus current limiting resistors to define the maximum forward current applied by Vc to diode 42. Resistors 18, 20, 22, 48 and 50 are part of the conventional biasing network for transistors 12 and 14, while inductor 52 is chosen to set the center frequency of amplifier 10.

The effective RF resistance at node 26 is thus controlled by varying the forward current through diode 42. PIN diodes are characterized in general by having an almost pure resistance at RF frequencies, whose value can be varied from approximately 10 kohm to less than 1 ohm by the control current, Ip. Although all diodes show this behavior to some extent, the PIN diode is optimized to show this characteristic over a wide resistance range, with good linearity, low distortion and low control current drive.

Figure 2:
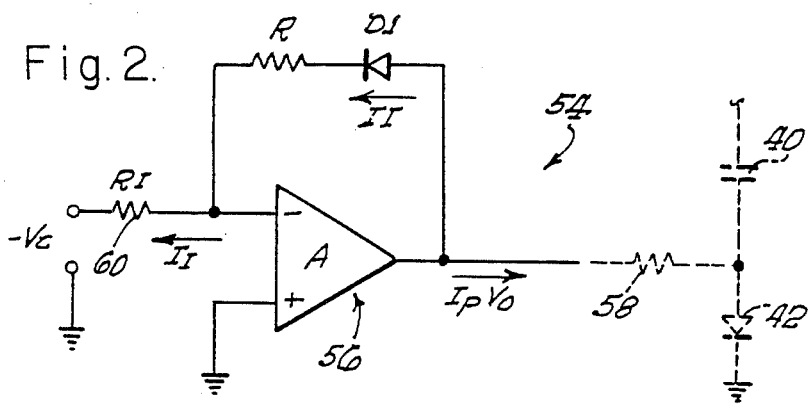
FIG. 2 is a schematic diagram of a temperature compensation subcircuit used in combination with portions of the circuitry of FIG. 1.

Turn briefly to the schematic diagram of FIG. 2. The PIN diode junction voltage changes as a function of temperature. Therefore, it is difficult to control the gain control current, Ip, accurately if the control voltage is directly applied to the PIN diode as the temperature of diode 42 changes. To effect such control, a subcircuit, generally denoted by reference numeral 54 in FIG. 2, is substituted into amplifier 10 of FIG. 1 in place of subcircuit 24.

The gain control voltage, Vc, is coupled to the input of an operational amplifier, generally denoted by reference numeral 56. The output of amplifier 56 is a voltage, Vo, and a gain control current, Ip. A resistor 58 serves as a current limiting resistor for diode 42. As before, diode 42 is coupled to node 26 of amplifier 10 by coupling capacitor 40. The remaining portion of amplifier 10 has been omitted from the simplified schematic of FIG. 2 for the purposes of clarity of illustration. It follows immediately that:

$$Ip = -Vc/Ri$$

where
Ip is the gain control current at the output of amplifier 56;
Vc is the input gain control voltage at the input of amplifier 56; and
Ri is the input resistance of resistor 60.

It is important to note that Ip is independent of the DC junction voltage of diode 42. Therefore, when used in the circuit of FIG. 2, the forward current through diode 42 will be automatically adjusted to be independent of the diode's DC junction voltage and, therefore, temperature independent. If Ip is thus temperature independent, then in the equation for the diode RF resistance given above, R will also be temperature independent.

Therefore, what has thus far been described is a single stage, log linear gain controlled, and temperature independent amplifier. In other words, a temperature independent, accurate gain control is provided in amplifier 10 as long as an AGC log linear voltage, Vc, is provided to the input of subcircuit 54 of FIG. 2.

Figure 3:
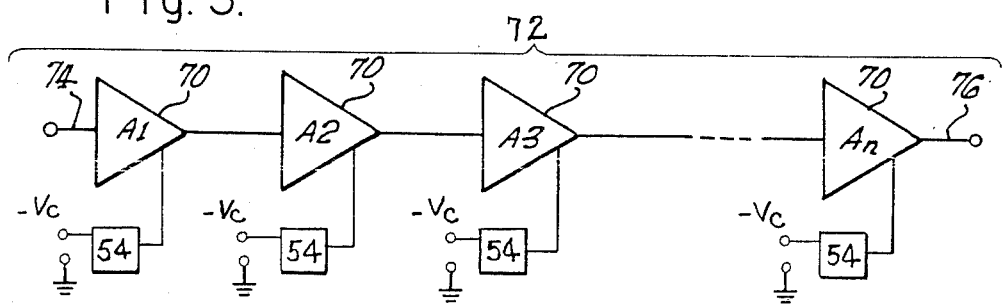
FIG. 3 is a block diagram of a plurality of amplifiers as described in connection with FIGS. 1 and 2 shown as serially cascaded.

In summary, the amplifier incorporates a PIN diode whose resistance is used to cottrol the gain of each stage of the amplifier. The PIN diode is used in a temperature compensation circuit so that the RF resistance of the diode is temperature independent. Multiple stages of the basic amplifier block are cascaded to achieve higher gains and AGC ranges. FIG. 3 is a block schematic of a plurality of amplifiers 70 such as described above with each amplifier coupled in series to comprise a cascade of n amplifiers, A1, A2, A3, ... An. Each amplifier 70, Ai, is provided with a common PIN diode ccurrent, Ip, generated by input voltage Vc and subcircuits 54, as the AGC signal. Thus, the cascade of amplifiers can be treated as a single amplifier, generally denoted by reference numeral 72, with an input 74, output 76 and AGC control signal, Ip (or Vc). The log linear characteristic of the PIN diode is used so that the overall gain of the cascaded stages in dB can be expressed as:

$$\text{Gain in } dB = a + b \ln(-V)$$

where

V is the channel's AGC voltage commonly applied to each stage; and a and b are constants which can be determined by calculations based upon the measured output voltage of each channel at predetermined AGC voltages.

Normally, a number of amplifiers 10 (or 70) are cascaded to obtain the desired overall gain. As previously stated, the gain of each stage will be determined by the diode resistance of each corresponding PIN diode 42. However, each PIN diode will not have exactly the same characteristics denoted algebraically by constants A and B above. It can be shown that the product of the voltage gains of n cascaded stages of amplifiers 10 (or 70) can be written as:

$$\log \text{Gain} = \sum_{n=1}^{N} [An + Bn \log(-Vn/RIn) - \log Rin]$$

where

Gain is the overall gain of n cascaded stages;
An is the A constant for the nth stage;
Bn is the B constant for the nth stage;
Vh is gain control voltage for the nth stage;
RIn is the input resistance of resistor 60 of FIG. 2 for the nth stage; and
Rin is the input resistance of amplifier 10 of the nth stage.

However, An, Bn, RIn and Rin are all constants. Therefore, after some further algebraic reduction, it can be stated that if the gain control voltage is common among each stage, namely V, then:

$$\log \text{Gain} = a + b \log(-V)$$

where a and b are constants which are functions of summations of An, Bn, RIn and Rin.

Now, if V is set according to the invention to $-1$ volt, then the gain is:

$$\log \text{Gain}(-1 \text{ volt}) = a.$$

If V is set to $-10$ volts, then:

$$\log \text{Gain}(-10 \text{ volts}) = a + b.$$

Therefore, empirically the values of a and b can be determined from values of the Gain at certain AGC voltages. Since, $$\text{Gain} = Vout/Vin,$$

where

Vout is the output voltage of the n cascaded stages; and
Vin is the input voltage of the n cascaded stages, we can restate the equation for log Vout as:

$$\log Vout = \log Vin + a + b \log(-V).$$

Now each channel of a multiple channel amplifier will have cascaded stages in the IF amplifier. The constants a and b for each channel will be different. Therefore, it is necessary to determine the a and b constants for each channel during calibration so that the overall gain for each channel can be set equal by appropriately adjusting the AGC voltage in each channel.

According to the invention, the calibration procedure for a multiple channel amplifier comprises the steps of supplying the same input voltage Vi to each channel and measuring the output voltage at each channel for two values of the AGC voltage. The above equation is expressed as a logarithm to the base 10, but could be expressed in any base. For instrumentation reasons, natural logarithms are convenient. Therefore, using natural logarithms and expressing gain in dB (i.e., $dB = 20 \log \text{gain} = 8.69 \ln \text{gain}$):

$$8.69 \ln Vout = a + 8.69(\ln Vin + b \ln(-V))$$

or, $$\ln Vout = a/8.69 + \ln Vin + b \ln(-V).$$

Setting $-V$ to one volt, we would measure for the jth channel $$a(j)/8.69 = \ln Vout(j, 1) - \ln Vin(j, 1)$$

where the arguments j and 1 have been added to each of the quantities to show that the quantity corresponds to the jth channel of the multiple channel amplifier corresponding to an AGC voltage of $-1$ volt.

Similarly, if we set the AGC voltage to 2.718, then we would measure:

$$b(j) = \ln Vout(j, 2.718) - \ln Vin(j, 2.178) - a(j)/8.69.$$

It should not be forgotten that a(j) and b(j) are constants with respect to the AGC voltage and, therefore, the same values of a(j) and b(j) are determined in both of the last two equations written above. The above equations will uniquely determine each of the a(j) and b(j).

According to the invention, the output voltage of the first channel, j=1, will be measured as:

$$\ln V_{Out}(1, V) = \ln V_{in}(1) + a(1)/8.69 + b(1)\ln(-V).$$

Assume that it is desired to adjust channel 1 to a predetermined magnitude of gain. We therefore want to adjust the AGC voltage to a value which will put the output voltage of the first channel at a predetermined value above the input voltage of the first channel. Let the adjusted AGC voltage which accomplishes this be labeled as V'. Thus, before adjustment of the AGC voltage, we have:

$$l V_{out}(1, V) = \ln V_{in} + a(1)/8.69 + b(1)\ln(-V)$$

and after adjustment we have:

$$\ln V_{out}(1, V') = \ln V_{in} + a(1)/8.69 + b(1) \ln(-V').$$

These equations can be combined and restated as:

$$V' = V(V_{out}(1, V')/V_{out}(1, V))1/b(1).$$

Consider now the procedure according to the invention wherein the gain of each of the channels of a multi-channel amplifier are equalized. Assume that each of the constants a(j) and b(j) have been determined for each channel according to the calibration procedure discussed above. To find the AGC voltage for each channel, it is only necessary to set the gain of the remaining channels relative to a selected channel, e.g., channel 1. While channel 1 has been selected herein as the reference or master channel, practice indicates that the master channel should be selected as that channel which has the highest gain. Its high gain is then adjusted so that its output will remain within a desired operating range. The gain of the remaining channels are then set (slaved) to be equal to the gain of the selected master channel. Each channel's relation to channel 1 can be expressed as:

$$8.69 \ln(V_{out}/V_{in}) = a(1) + 8.69 \, b(1) \ln(-V(1)),$$

$$8.69 \ln(V_{out}/V_{in}) = a(j) + 8.69 \, b(j) \ln(-V(j)).$$

Combining and rewriting these equations, we get:

$$\ln(-V(j)) = C + D \ln(-V(1))$$

where
V(j) is the AGC voltage that must be applied to the channel j to make its gain equal to channel 1;
V(1) is the AGC voltage applied to channel 1 at a predetermined value;
$C = (a(1) - a(j))/(8.69 \, b(j))$; and
$D = b(1)/b(j)$.

By way of practice, to determine constants and execute each channel AGC voltage in a real system, it is not necessary to actually perform these calculations. The following is an example of a two-channel system. For the sake of clarity of illustration in this example, the constant factors, a and b, have been replaced by the constants, K.

(1) Set the input reference signal at the same value for each channel at, for example, X dBm.

(2) Both channel's AGC is set at −1.00 volt and the output of each channel is measured. The output of channel 1 is K11 dBm and the output of channel 2 is K21 dBm.

(3) The AGC of both channels is then set at −2.718 volts and the output of the channels are again measured. The output of channel 1 is K12 dBm and the output of channel 2 is K22 dBm.

(4) By arithmetic calculation, we then derive the characteristic constants for each channel, namely for channel 1 it is K1=K11−K12 and for channel 2 it is K2=K21−K22.

At this point, we now know the characteristic constant for gain for each cascaded channel. The gains of two channels are matched as follows.

(1) The input of the selected master channel, e.g. channel 1, is provided with a signal of the desired working input magnitude.

(2) The output of channel 1 is measured with an AGC of −2.718 volts. The output is labeled in this discussion as M dBm.

(3) By calculation, we derive a value of AGC voltage of channel 1, $$V1 = -2.718 \exp[(L+M)/K1].$$

The value "L" is the nominal output voltage desired in the circuit. If the absolute value of V1 is less than or equal to the minimum AGC voltage, the we set V1 equal to the minimum voltage that the amplifier is set at aximum gain. If the absolute value of V1 is greater than the minimum AGC voltage, then we set the AGC voltage at the derived vlaue.

(4) The gain of the channel 2 AGC is now set to $$V2 = -\exp[(K21 + K1 \ln(-V1) - K11)/K2].$$

After V2 is set, the gain difference between channel 1 and channel 2 will be less than 0.5 dB.

(5) In some systems, a channel gain difference of 0.5 dB may not be sufficient. In this case, the same input signal is coupled to both channels and the output of each channel is measured. By calculation, set channel 2's AGC voltage at $V2' = V2 \exp[M1 - M2]/K2$. After readjustment of V2', the channel gain difference between the two channels will be very close to the minimum errors of measurement.

In practice, the output signal from the cascaded channels changes as the distance to the target or the magnitude of the return signal to the channel's input changes. Therefore, during operation, it may be necessary to step the gain of the channels downward or upward while maintaining their balance. Assume that the gain needs to change by X dB. The change in AGC voltage for each channel can readily be calculated by:

$$V1' = V1 \exp[X/K1]$$

$$V2' = V2 \exp[X/K2]$$

where V1' is the new AGC voltage needed for channel 1 and V1 was the previous AGC voltage on channel 1; similarly, V2' is the new AGC voltage for channel 2 and V2 the previous AGC voltage for channel 2. Despite the changes in AGC, the two channels will retain an equal gain according to the invention.

Therefore, according to the invention, one of the channels is chosen as the master channel and the above equations are then utilized to set the AGC voltages in each of the remaining channels equal.

The invention is thus characterized as applicable to an amplifier incorporating a PIN diode whose resistance is used to control the gain of each stage. The PIN diode is used in a temperature compensation circuit so that the RF resistance of the diode is temperature independent. Multiple stages of the basic amplifier block are cascaded to achieve higher gains and AGC ranges. The log linear characteristic of the PIN diode is used so that the overall gain of the cascaded stages in dB can be expressed as:

$$\text{Gain in } dB = A + B \ln(-V)$$

where

V is the channel's AGC voltage commonly applied to each stage; and a and b are constants which can be read out from the output voltage of each channel at predetermined AGC voltages.

In the case where multiple channels are used, a common input voltage is provided to each channel for calibration. According to the method of the invention, two predetermined AGC voltages are then applied to each channel and a set of a's and b's are read out from the output voltages of each of the channels. With the use of the values for a and b thus read, the gain of any channel may be set to any desired value within the range of the amplifier, and the multiple channels may each be set to have an equal gain.

Figure 4:
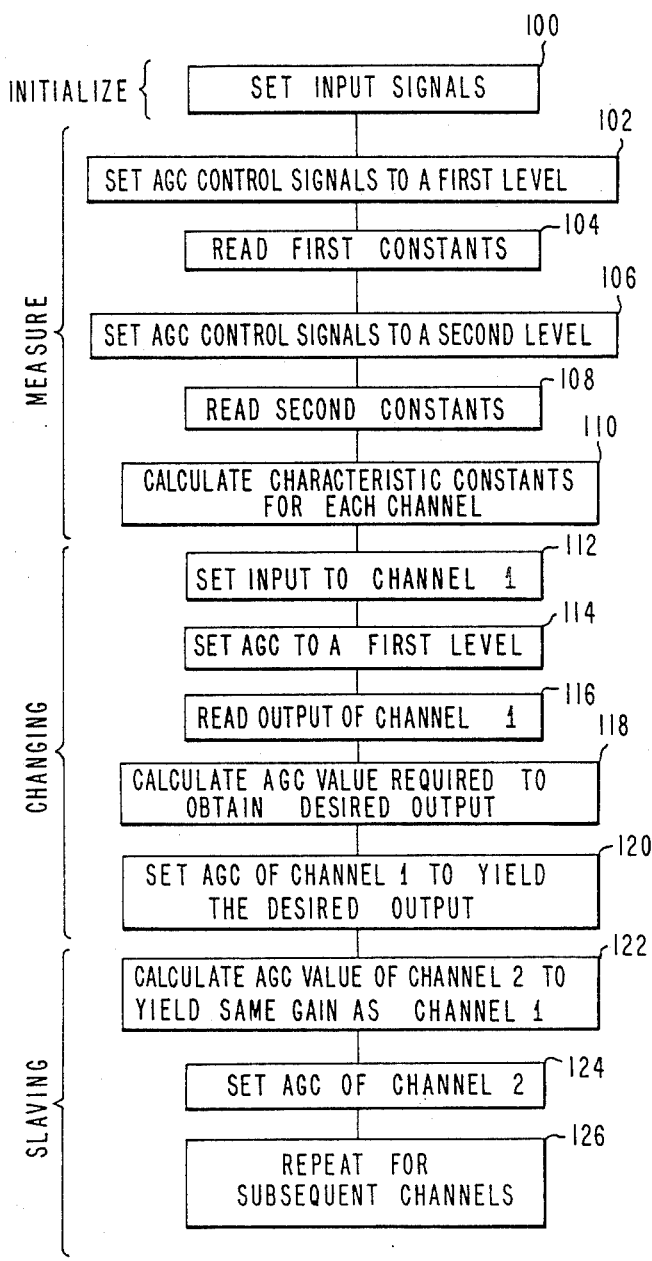
FIG. 4 is a flow chart illustrating the steps of the method of the invention.
Figure 5:
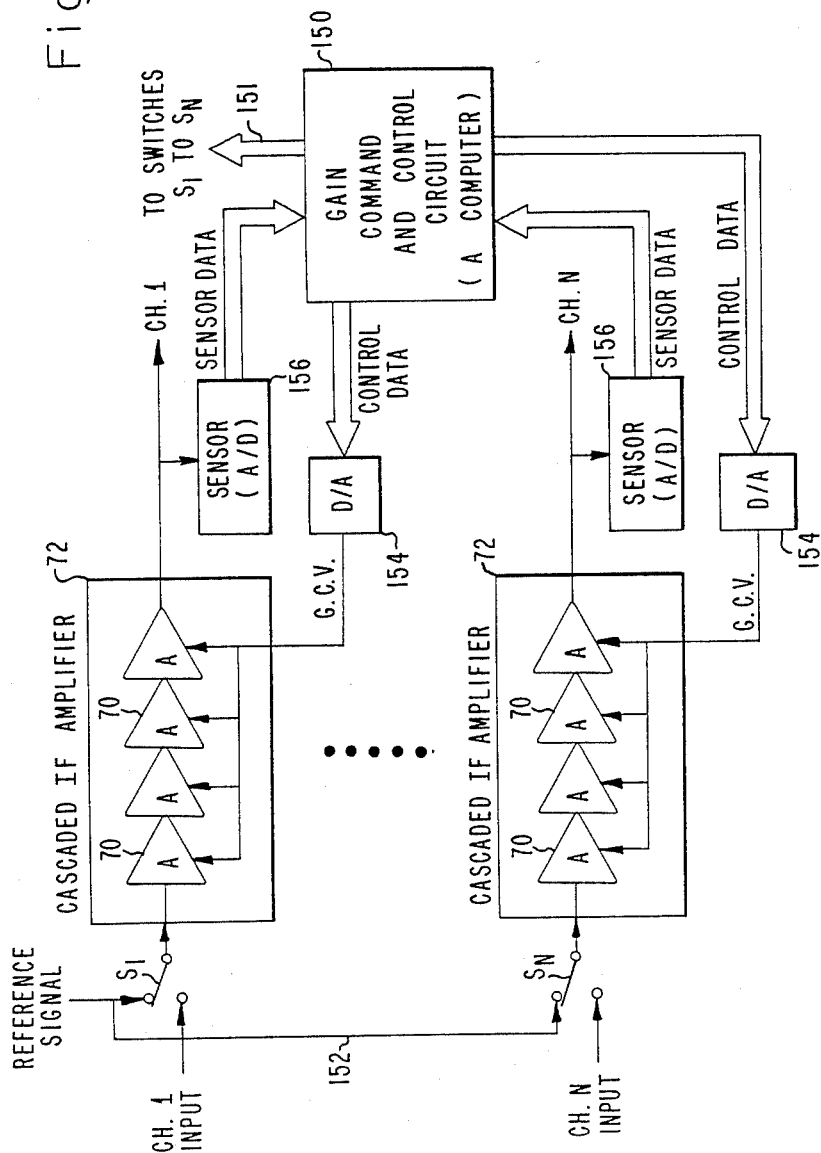
FIG. 5 is a circuit block diagram of the system for carrying out the method of the invention.

The method of the invention as discussed herein may be illustrated in flow chart/block diagram form as shown in FIGS. 4 and 5. The first step in implementing the method of the invention is to set the input signals to each channel to be equal to a reference level signal and may be referred to as the step of initializing the inputs. This step is shown in box 100 of FIG. 4. This step is implemented as shown in FIG. 5 by a computer controlled system. The computer 150 is programmed to generate control signals 151 to operate the switches $S_1$ to $S_N$ thus switching from the normal input signal to the input reference signals 152 and is programmed to perform the gain command and control function as well as perform mathematical calculations to determine amplifier constants as discussed above, and to perform the many other functions such as timing, making interrupts as necessary and other functions commonly performed by such devices. The reference signal 152 is the same signal level, within the desired operational signal level of the amplifier channels 72, for each channel and is switched to the input of each channel by switches $S_1 \ldots S_N$. Each channel 72 consists of a cascade of a plurality of amplifiers 70 as shown in FIG. 3, however, for the sake of simplicity the subcircuits 54 have been omitted.

The second step in implementing the method of the invention is to measure the various outputs of each channel and based on those measurements calculate the characteristic constants of each channel. This measuring step comprises the various substeps illustrated in boxes 102 through 110. First, the automatic gain control (voltage) signal supplied to each channel is set to a first selected level, as shown by box 102. This step is implemented by the computer 150 which retrieves the stored value of this voltage from its memory and provides it to a digital to analog converter 154 where it is converted to an analog signal and provided to the amplifier 72 of each channel. This first gain control voltage (G.C.V.) level will have a value depending on the logarithm base used as explained above. For example, if a base 10 is used, the gain control voltage (G.C.V.) will be set to a first value of −1 volts for each channel. If a natural logarithm (base e) is used the first value for the gain control voltage is also −1 volts.

Once the input signals have been set (box 100) and the gain control voltages set (box 102) the first amplifier constants for each amplifier (each channel) can be read. This is illustrated by box 104 in FIG. 4. The step is implemented under the direction of computer 150 and sensors 156. The output of each channel is sensed by a voltage sensor and analog to digital (A/D) converter 156. This digital representation of the output voltage for each channel is transmitted to the computer 150. The ratio of output divided by input is the gain of the amplifier channel. The computer calculates the log of this gain and stores this result for each channel in memory. The value so stored, for each channel, represents the first constant a for each channel 1 through N.

The second constant for each channel is determined in a similar manner. The automatic gain control voltage (G.C.V.) is set to the same precalculated level for each channel. This is illustrated by box 106. The second GCV level is −10 volts for log to base 10 and is −2.718 volts if the natural logarithm base e is used. The value of these voltages are recalled from the memory of computer 150 and provided through D/A converters 154 to each amplifier 72. Now the output of each channel can be sensed to "read" the second constant (constant b) for each channel. This is accomplished by sensor 156 which senses the output voltage and converts it to a digital signal. This digitized output signal is then provided to computer 150. The computer calculates the log of the gain for the channel (log of output/input). The constant b for each channel is determined by subtracting the channel's a constant from the calculated log of the gain value for that channel. This is illustrated by box 108 of FIG. 4.

Once the a and b constants have been determined as above, the characteristic constants C and D can be calculated. This step is shown in box 110. Constants C and D, which are different for each channel, are used to determine the adjustments in gain to be made to each channel in order to match its gain to the gain of the master channel, which may be channel 1. This procedure is the slaving procedure and is illustrated in boxes 122–126. However, before slaving all the remaining channels to channel 1, it may be desirable to change the gain of channel 1 to insure that its output is within the desired operating range. This procedure for changing (i.e. adjusting) the gain of channel 1 comprises the steps shown in boxes 112–120.

First, the input signal level to channel 1 must be set. This is shown as box 112 in FIG. 4. It is set in the same way as in box 100 except here only the input to channel 1 is set. Then, the accurate gain control voltage (GCV) to the first channel is set, as illustrated in box 114. This GCV is set by computer 150 as previously described with respect to box 102. Next, the output voltage of channel 1 is read, digitized and provided to the computer as in box 116. Since the input voltage, output voltage and a and b constants are known for channel 1, the computer can then calculate the new value for the GCV which is required to bring the output within the desired operating range. These calculations are performed in box 118 of FIG. 4. Lastly, the computer sets the GCV to the value calculated as illustrated in box 120. The GCV of channel 1 is now set so as to insure that the output of channel 1 will fall within the desired operating range. Channel 1 can now be used as a master channel.

The procedure for slaving the gain of channels 2 through N to the gain of channel 1 to insure accurate gain matching of all channels is illustrated by the steps shown in boxes 122–126. The first step for slaving channel 2 to channel 1, is to calculate the AGC voltage level for channel 2 that will give channel 2 the same gain as channel 1. This, in turn, is accomplished by performing on channel 2 the same steps as were performed on channel 1 and illustrated in boxes 112, 114 and 116. At that point the computer can calculate the gain control voltage magnitude that is required to cause channel 2 to have the same gain as channel 1. This is illustrated in box 122. After making the calculation, the computer then causes the GCV of channel 2 to be set to the calculated value (Box 124). At this point the gain of channel 2 will be identical to the gain of channel 1. The gain of subsequent channels 3 through N can similarly be slaved to be identical to the gain of channel 1 (or any of the channels chosen as the master channel).

It should be apparent from the above description of the computer implementation of the method of the invention that the gains of the channels of the amplifiers can be calibrated and slaved to a master channel automaticaly without the use of any additional test equipment. If a multi-channel amplifier system is carried on-board an aircraft or other vehicle, the method can be used to calibrate and accurately match the gain of all channels as frequently as permitted by the hardware, in flight, without significantly interrupting the operation of the system. Thus, as time passes and temperature changes affect the components of each channel differently, thus causing unequal gain changes in the various channels, the method of the invention will automatically and precisely match the gain of all channels to the gain of a selected master channel.

It is to be expressly understood that while the channels have been described as amplifiers 72, each comprising a cascaded series of amplifiers 70, each channel could as well comprise a single amplifier 70. The log linear relationship of the gain and controlling PIN diode resistance allows the cascade of amplifiers to be treated in the same way as a single amplifier 70 would be treated by the method of the invention.

Many modifications and alterations may be made by those having ordinary skill in the art without departing from the spirit and scope of the invention. For example, in determining the values of the a and b factors, two specific voltages, 1 and 2.718 volts were used. However, it is expressly contemplated by the invention that any two values of AGC voltage could be appropriately used according to the teachings of the invention without departing from its scope. Therefore, the illustrated embodiment must be read only as an example which has been set forth for the purposes of clarity and not as a limitation of the invention as defined in the following claims.

What is claimed is:

1. An improved method for automaticallly calibrating the gain of each channel of a multi-channel amplifier wherein each channel is gain controlled by a gain control signal applied and controlled by a computer and the gain in decibels of each channel is defined by the function $$G = C + D \log(-V)$$

where
G is the gain of a channel being calibrated,
V is the magnitude of the gain control signal,
C and D are constants corresponding to a particular channel being calibrated, said improved method comprising the implementation by computer of the steps of:
initializing the input voltage signal to said channel;
setting the magnitude of said gain control signal applied to an amplifier of said channel to a preselected first value;
measuring the output signal of said channel;
calculating a first of said constants of said channel based on said input voltage signal magnitude and the magnitude of said measured output signal;
setting the magnitude of said gain control signal applied to said amplifier of said channel to a preselected second value;
measuring the output signal of said channel;
calculating a second of said constants of said channel based on said input voltage signal magnitude and the magnitude of said measured output signal; and
adjusting the magniutde of said gain control signal applied to said amplifier of said channel such that the channel's gain, as defined by the above function, is adjusted to a desired value.

2. The method of claim 1 further comprising the step of selecting said desired value of each channel to a value common to all said channels, whereby each channel is provided with a matched and calibrated gain.

3. The method of claim 1 further comprising the step of preselecting said first value as one volt and preselecting said second value as 2.718 volts.

4. The method of claim 1 further comprising the step of preselecting said first value as one volt and preselecting said second value as 10 volts.

5. The method of claim 1 further comprising the step of preselecting said first value as one volt and preselecting said second value as X volts, said gain of said channel being a logarithmic function of V to the base X.

* * * * *